(12) United States Patent
Stahl et al.

(10) Patent No.: US 6,705,389 B1
(45) Date of Patent: Mar. 16, 2004

(54) RECONFIGURABLE SYSTEM AND METHOD FOR COOLING HEAT GENERATING OBJECTS

(75) Inventors: Lennart Stahl, Plano, TX (US); Christian Belady, McKinney, TX (US)

(73) Assignee: Emerson Electric Co., St. Louis, MO (US)

( * ) Notice: Subject to any disclaimer, the term of this patent is extended or adjusted under 35 U.S.C. 154(b) by 0 days.

(21) Appl. No.: 09/617,391

(22) Filed: Jul. 17, 2000

(51) Int. Cl.[7] ............................ F28F 27/00; F25D 15/00; F24H 3/02; H05K 5/00; H05K 7/20
(52) U.S. Cl. ..................... 165/96; 165/121; 165/104.34; 454/184; 361/696
(58) Field of Search ..................... 165/53, 96, 97, 165/121, 122, 104.34; 454/184, 186; 361/695, 696

(56) References Cited

U.S. PATENT DOCUMENTS

| | | | | |
|---|---|---|---|---|
| 3,292,688 A | * | 12/1966 | Shrader | 165/122 |
| 4,138,857 A | * | 2/1979 | Dankowski | 62/239 |
| 4,333,520 A | * | 6/1982 | Yanadori et al. | 165/122 |
| 4,522,255 A | * | 6/1985 | Baker | 165/122 |
| 5,050,667 A | * | 9/1991 | Berner et al. | 165/4 |
| 5,444,990 A | * | 8/1995 | McGill, III et al. | 62/298 |
| 5,718,628 A | * | 2/1998 | Nakazato et al. | 454/184 |
| 5,721,670 A | * | 2/1998 | Cochrane et al. | 361/695 |
| 6,362,960 B1 | * | 3/2002 | Ducourt et al. | 361/695 |

FOREIGN PATENT DOCUMENTS

| | | | | |
|---|---|---|---|---|
| EP | 458770 A1 | 5/1991 | | H05K/7/20 |
| EP | 985889 A2 | 7/1999 | | F24F/1/00 |

* cited by examiner

*Primary Examiner*—Henry Bennett
*Assistant Examiner*—Tho Van Duong
(74) *Attorney, Agent, or Firm*—Howrey Simon Arnold & White, LLP

(57) ABSTRACT

A method and system are disclosed for cooling a heat generating object. A coolant is passed through a heat exchanger so that heated air passing through a first portion of the heat exchanger is cooled. A fan unit is selectively positioned relative to the heat exchanger. When activated, the fan unit draws the cooled air through a second portion of the heat exchanger and directs the twice cooled air towards the heat generating object. The fan unit may be repositioned along a different portion of the heat exchanger so as to redefine the flow of air drawn from and directed towards the heat generating object.

29 Claims, 8 Drawing Sheets

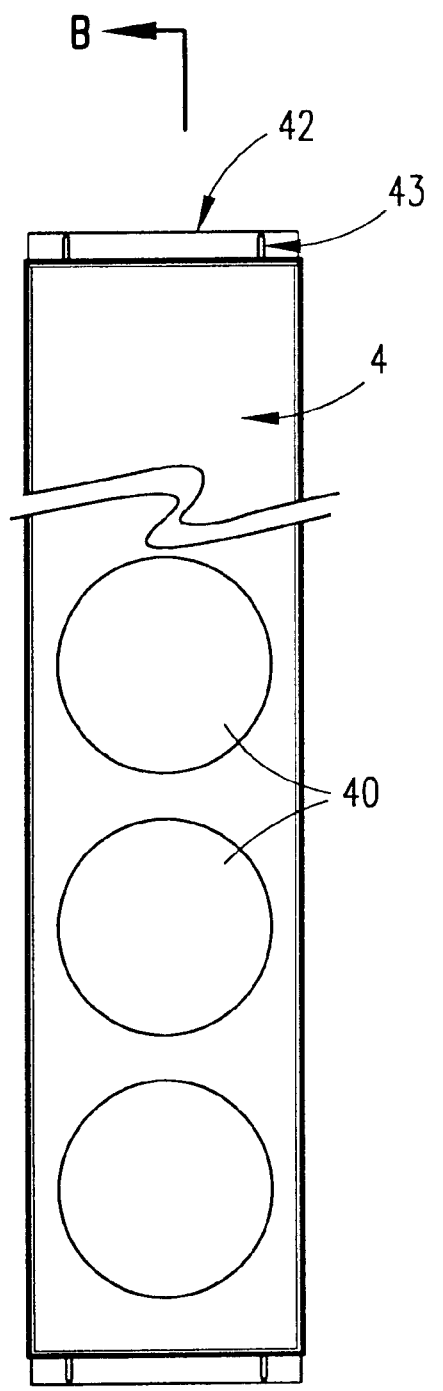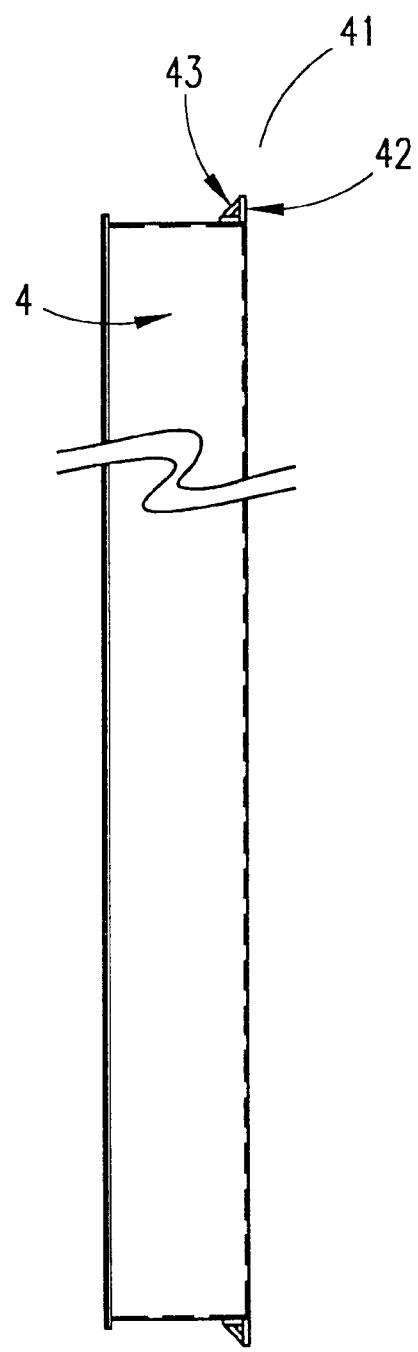
*FIG. 3*  *FIG. 4*

RECONFIGURABLE SYSTEM AND METHOD FOR COOLING HEAT GENERATING OBJECTS

CROSS REFERENCE TO RELATED APPLICATIONS

This application is related to U.S. Applications for Patent, Ser. No. 09/617,213 filed Jul. 17, 2000, entitled "Overhead Cooling System With Selectively Positioned Paths of Airflow".

BACKGROUND OF THE INVENTION

1. Technical Field of the Invention

The present invention relates to cooling systems for cooling electronic equipment, and particularly to systems for cooling electronic equipment that are reconfigurable to allow customized air flow in proximity to the electronic equipment.

2. Background and Objects of the Invention

The growth of the computer industry and telephony over the past few decades has been phenomenal. The integration of these technologies, for example, in telecommunications switching systems, has lead to greater and greater efficiencies as larger numbers of communications are handled by fewer components, which are typically housed in a central control room.

One problem inherent with many existing cooling systems for electronic equipment is rigidity. Many existing cooling systems are built into and/or under the flooring of a temperature-controlled room having equipment needing to be cooled. Such cooling systems employ fixed conduits or other piping for directing cooled air along a subsurface of the flooring and upwardly through the floor and towards the equipment to be cooled. The upwardly directed cooled air is in proximity to the equipment. In the event the temperature characteristics within the temperature-cooled room changes, such as by the equipment being moved within the room or by additional equipment being added therein, it is very difficult to modify the cooling system accordingly. For instance, the conduits have to be detached from their fixed positions and repositioned, or replaced in favor of differently sized conduits. Consequently, altering the cooling characteristics of existing cooling systems frequently proves a costly adventure.

Floor-based cooling systems present additional difficulties other than rigidity in its cooling characteristics. For instance, floor-based cooling systems that do not utilize conduits for passing cooled air occupy more area so that equipment cabling and other obstructions do not cause uneven air distribution or a reduction in air pressure. Such systems require the equipment cabling to be plenum rated, thereby increasing system cost. Floor-based cooling systems also possess the tendency to distribute noise and vibrations, which may effect the operation of the equipment to be cooled.

In addition, floor-based and other existing cooling systems have a rather limited cooling capability. For instance, existing cooling systems have heat densities of approximately 80 watts per square foot (w/ft$^2$) with planned cooling systems being claimed to possess heat densities of up to 150 w/ft$^2$. Cooling systems having such heat densities, however, may not effectively cool today's equipment, such as state-of-the-art computational equipment.

As is readily apparent, if equipment is not effectively cooled, the internal temperature of the electronic components in the equipment substantially increases, thereby leading to significantly reduced system performance and, in some cases, total system failure. If a cooling system inefficiently cools the equipment, either the equipment may fail due to increased operating temperature or the costs for cooling the equipment may be unnecessarily high. What is needed, then, is a cooling system having its cooling characteristics closely tailored to the heating characteristics of the equipment to be cooled.

SUMMARY OF THE INVENTION

The present invention overcomes the above-discussed shortcomings and satisfies a significant need for a cooling system for cooling a heat generating object. In accordance with a first embodiment of the present invention, a cooling system includes a frame and a heat exchanger, such as a cooling coil, connected thereto so that airflow is capable of passing through the frame in proximity to the heat exchanger. A fan unit is connected to the frame adjacent to the heat exchanger so that when the fan unit is activated, a first path of airflow passes through the frame in proximity to the heat exchanger through a first portion of the heat exchanger in a first direction and a second path of airflow passes through a second portion of the heat exchanger in a second direction substantially opposite said first direction. In addition, the fan unit is selectively adjustable along the heat exchanger so that the first and second paths of airflow may be repositioned to the desired locations along the heat exchanger and thus the heat generating object. The present invention thus provides a reconfigurable cooling system that is selectively customized to particular cooling requirements.

The operation of the embodiment of the present invention includes drawing air from the heat generating object through the first portion of the heat exchanger so as to define the first path of air flow. The fan unit draws air from the first path of airflow through the second portion of the heat exchanger and directs the drawn air toward the heat generating object in the second path of airflow. In the event heat generating dynamics of the heat generating object changes, the fan unit may be moved along the heat exchanger so that the first and second paths of airflow may be redefined.

BRIEF DESCRIPTION OF THE DRAWINGS

A more complete understanding of the system and method of the present invention may be obtained by reference to the following Detailed Description when taken in conjunction with the accompanying Drawings wherein:

FIG. 3 is a bottom plan view of a fan unit of the cooling system of FIG. 1;

FIG. 4 is a side elevational view of the fan unit of FIG. 3 taken along line B—B thereof;

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 1:
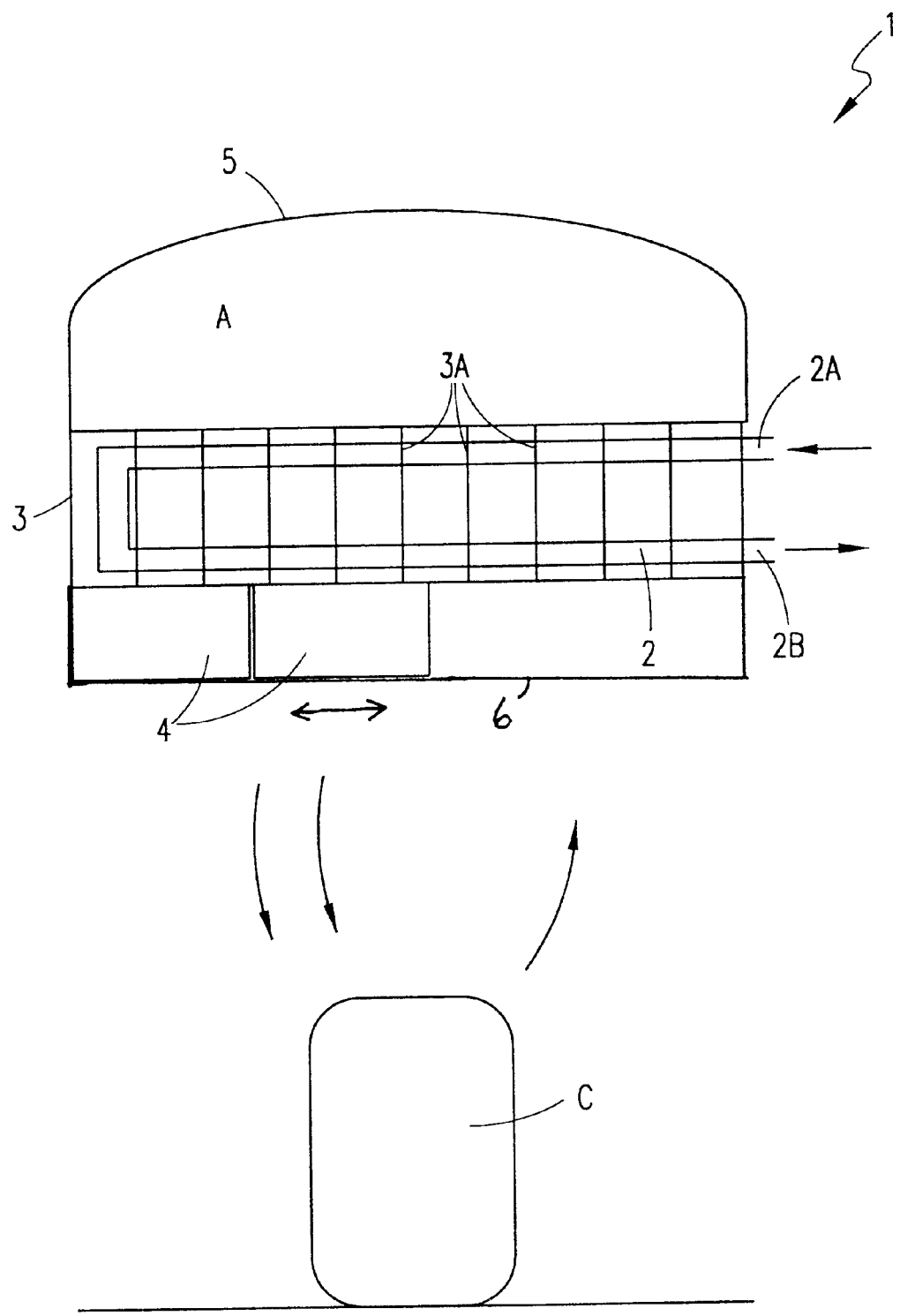
FIG. 1 is a side elevational view of a cooling system in association with heat generating equipment, in accordance with an embodiment of the present invention.

Referring to FIGS. 1–8, there is shown a cooling system 1 according to an embodiment of the present invention. Cooling system 1 is adapted to provide cooled air to one or more heat generating objects, such as a computer equipment C. As shown in FIG. 1, cooling system 1 may be disposed above the heat generating object(s) C cooling system 1 is intended to cool. As such, cooling system 1 may be attached along or suspended from a ceiling of the room in which the heat generating object C is located.

Cooling system 1 includes at least one heat exchanger 2 through which a coolant fluid is passed. Heat exchanger 2 may be a cooling coil or other comparable device. Air is cooled by being directed through or in proximity to heat exchanger 2. According to the embodiment of the present invention shown in FIG. 2, heat exchanger 2 is sized so that a length 1 and width w thereof are substantially larger than a height of heat exchanger 2. In this way, a sizeable amount of air is capable of passing in a transverse (vertical) direction through or in proximity to heat exchanger 2 and cooled thereby. Heat exchanger 2 includes an inlet 2A and an outlet 2B for receiving and discharging coolant, respectively. Coolant temperature and flow rate within heat exchanger 2 may be controlled manually or automatically.

Cooling system 1 further includes a frame member 3 to which heat exchanger 2 is attached. Frame member 3 is utilized for connecting various components of cooling system 1, as explained below. Cooling system 1 may be attached to or suspended from a ceiling or other object by connecting frame member 3 thereto. Frame member 3 may include fins 3A to facilitate air flow in a direction normal to heat exchanger 2.

Figure 8:
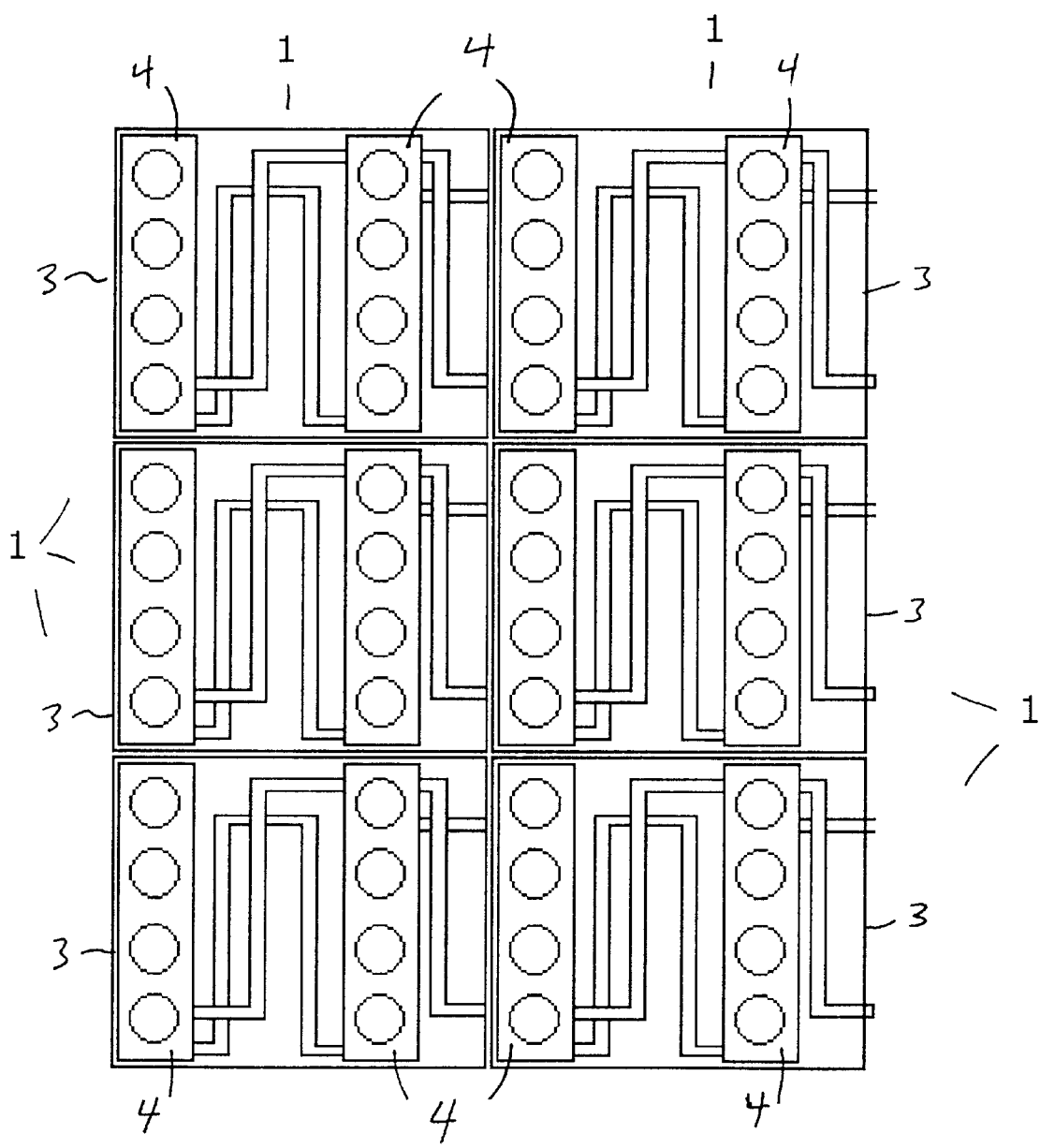
FIG. 8 is a bottom plan view of a plurality of cooling systems of FIG. 1 illustrating a modular aspect thereof.

Cooling system 1 may be modular so that a plurality of cooling systems 1 may be positioned adjacent each other along a ceiling and/or above one or more heat generating objects C. In particular, frame member 3 may be shaped to engage with and/or securely attach to a frame member 3 of another cooling system 1. As shown in FIG. 8, frame member 3 may be shaped so that multiple cooling systems 1 may be positioned substantially flush against each other. In this way, an array or matrix of cooling systems 1 may effective cool an enlarged room having heat generating equipment C.

Figure 2:
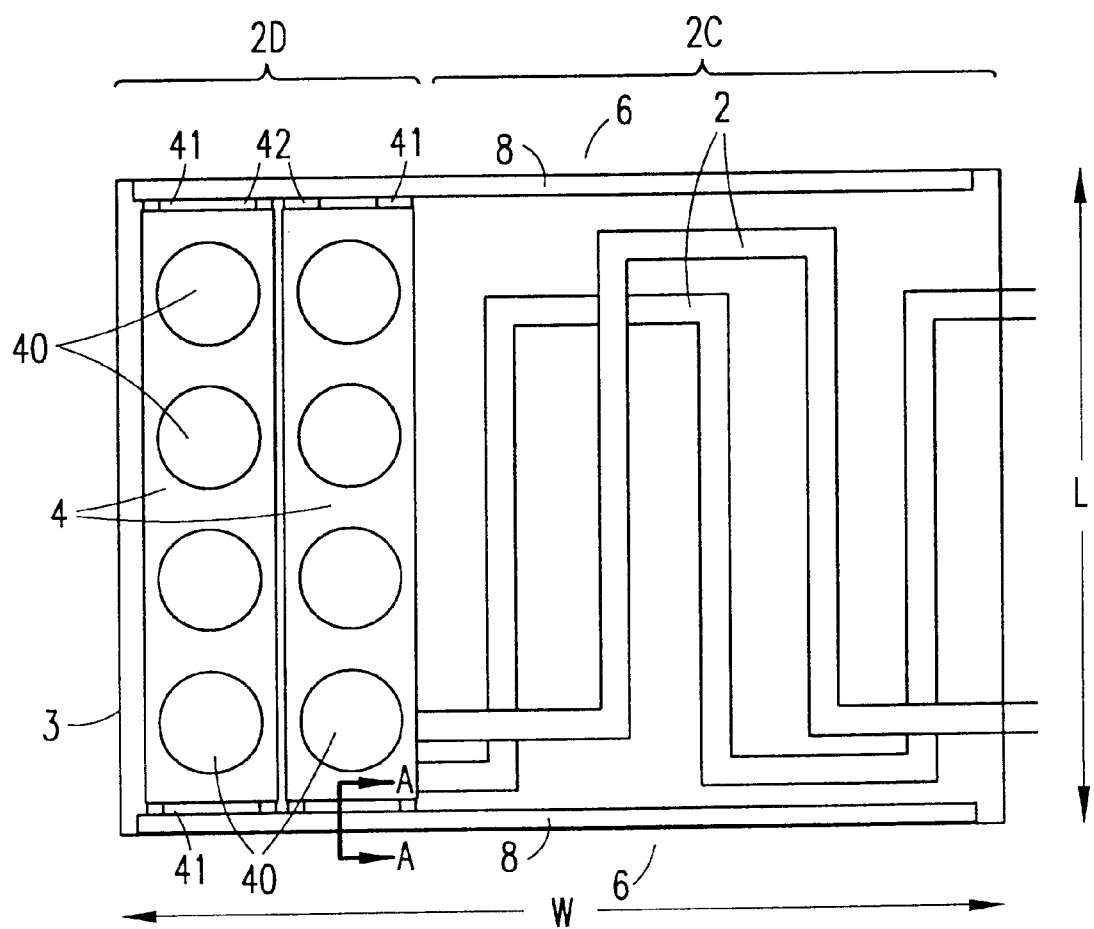
FIG. 2 is a bottom plan view of the cooling system of FIG. 1.

Cooling system 1 includes one or more fan units 4 that connect to frame member 3 adjacent heat exchanger 2. Each fan unit 4 draws air through heat exchanger 2 when activated. Fan units 4 occupy only a portion of the surface of heat exchanger 2, as shown by the bottom plan view of cooling system 1 (FIG. 2). In this way, heated air from heating object C may be drawn through a first portion 2C of heat exchanger 2 and cooled thereby, drawn through a second portion 2D of heat exchanger 2 by fan units 4 and thereupon directed towards heating object C.

Each fan unit 4 may include one or more fans 40. The operating speed of fans 40 may be fixed, manually varied or automatically varied to provide the desired cooling capacity. Although each fan unit 4 is shown as including four fans 40 (FIG. 3), it is understood that the number of fans 40 in each fan unit 4 may vary depending upon the operating requirements of cooling system 1.

Each fan unit 4 includes a bracket or flange member 41 that extends from opposed end panels thereof (FIGS. 3 and 4). In accordance with an embodiment of the present invention, each bracket member 41 includes a substantially L-shaped member 42 (FIG. 5), one side of which is secured to an end portion of fan unit 4. Bracket member 42 may further include a diagonal support member 43 connected between the sides of L-shaped member 42 so as to strengthen bracket member 41 and prevent deformation of L-shaped member 42. Bracket members 41 selectively engage with frame member 3 for connecting fan unit 4 thereto, as discussed in greater detail below.

A hood assembly 5 is connected to frame member 3 and positioned substantially entirely over heat exchanger 2 so as to define and area A therewithin, as shown in FIG. 1. When cooling system 1 is positioned over a heat generating object C, heated air generated therefrom is collected within area A through a portion of heat exchanger 2 that is not adjacent a fan unit 4, such as first portion 2C (FIG. 2). The collected air within area A is subsequently drawn by fan units 4 through a portion of heat exchanger 2 that is adjacent fan unit 4, such as second portion 2D, and directed towards heat generating object C. By heat exchanger 2 cooling the air as it is collected into hood assembly 5 and subsequently discharged therefrom, the twice cooled air is recirculated around heat generating object C so as to maintain operating temperatures thereof within a desired temperature range.

In a first embodiment of the present invention, hood assembly 5 is dome-shaped or otherwise includes tapered end portions, as shown in FIG. 1. It is understood, however, that hood assembly 5 may have other shapes.

Cooling system 1 is preferably dimensioned so that cooling system 1 unobtrusively hangs from a ceiling or other structure, without interfering with objects or persons underneath cooling system 1. By way of one example, the combined height of hood assembly 5 and frame member 3/heat exchanger 2 is approximately 18". It is understood, that the dimensions of cooling system 1, including the height thereof, may vary.

Because the thermal characteristics of heat generating object C may vary over time, such as by moving heat generating object C relative to cooling system 1 or adding equipment to or removing equipment from heat generating object C, it is advantageous to modify the cooling and/or operating characteristics of cooling system 1 accordingly. According to an embodiment of the present invention, cooling system 1 allows fan units 4 to be selectively repositioned along the surface of heat exchanger 2 nearest heat generating object C. In particular, frame member 3 includes one or more tray or shelf members 6 (FIG. 2) that are disposed substantially entirely along opposed end portions of frame member 3. Tray member 6 extends below heat exchanger 2 and is sized to receive fan units 4 therein. Fan units 4 may be disposed within tray member 6 at any of a plurality of locations substantially entirely along frame member 3 and/or tray member 6 thereof. In this way, fan units 4 are independently positionable along tray member 6/frame member 3. FIG. 8 illustrates fan units 4 of each cooling system 1 being separated from each other. By separating fan units 4 from each other, the second portion 2D of heat exchanger 2 to which fan units 4 are adjacent may be split into a plurality of spaced-apart portions.

Figure 5:
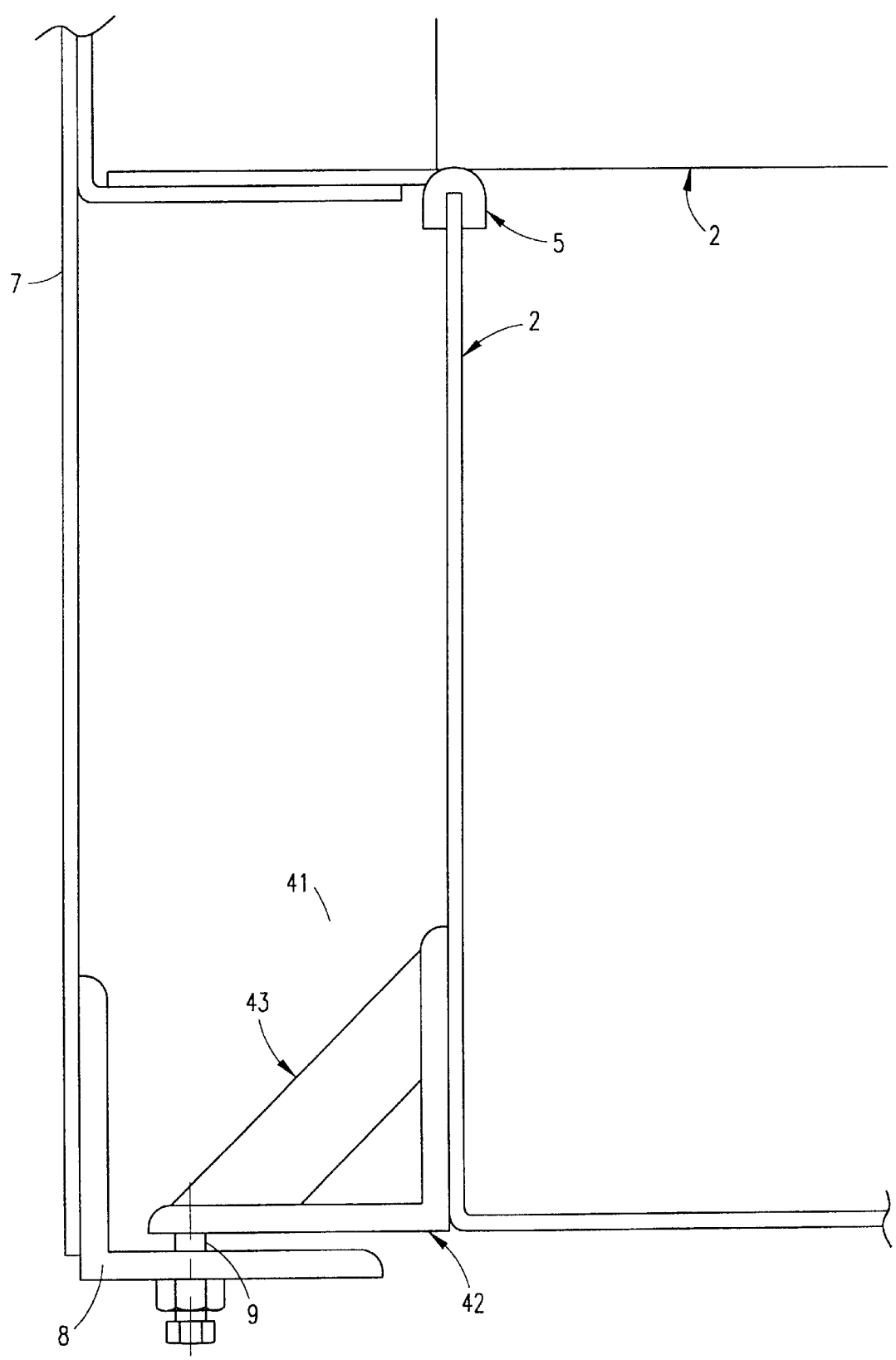
FIG. 5 is a side elevational view of a portion of the cooling system of FIG. 1 taken along the A—A line therein.

Referring to FIG. 5, each tray member 6 includes an extension member 7 that extends from frame member 3 and a ledge member 8 that extends from the unconnected end of extension member 7 in a substantially perpendicular relation thereto. Extension member 7 and ledge member 8 form a shelf upon which the outwardly extending portion of bracket member 41 rests so as to attach fan unit 4 to frame member 3. A bulbous shaped engagement member 9 may be disposed on an inner surface of ledge member 8 for supporting bracket member 41 of fan unit 4 so as to provide stability and particularly to prevent fan unit 4 from vibrating relative to frame member 3.

It is understood that fan units 4 may attach to frame member 3 in ways other than by engagement between bracket member 41 and tray member 6. For instance, fan units 4 may be removably attached to frame member 3 using screws, nuts and bolts, or clamp mechanisms.

As stated above, coolant is passed through heat exchanger 2 so that air passing in proximity to heat exchanger 2 is cooled thereby. Inlet 2A of heat exchanger 2 is positioned above outlet 2B so that coolant from a cooling source (not shown) is initially forced through the portion of the heat exchanger 2 closer to hood assembly 5 and thereafter returned to outlet 2B through the portion of the heat exchanger 2 that is closer to heat generating object C. Noting that the cooler portion of heat exchanger 2 is the portion thereof that receives the coolant, heated air that is drawn into hood assembly 5 remains cooler due to having more recently passed through the cooler portion of heat exchanger 2.

Cooling system 1 may be disposed within a room so as to cool heat generating objects therein. In this regard, it is understood that cooling system 1 may be sized for substantially occupying the ceiling of the room. Alternatively, a plurality of cooling systems 1 may be adjacent each other along the ceiling. In this way, a plurality of fan units 4 from the cooling systems 1 may be positioned to be in proximity to each air intake of the heat generating objects C in the room.

Figure 6:
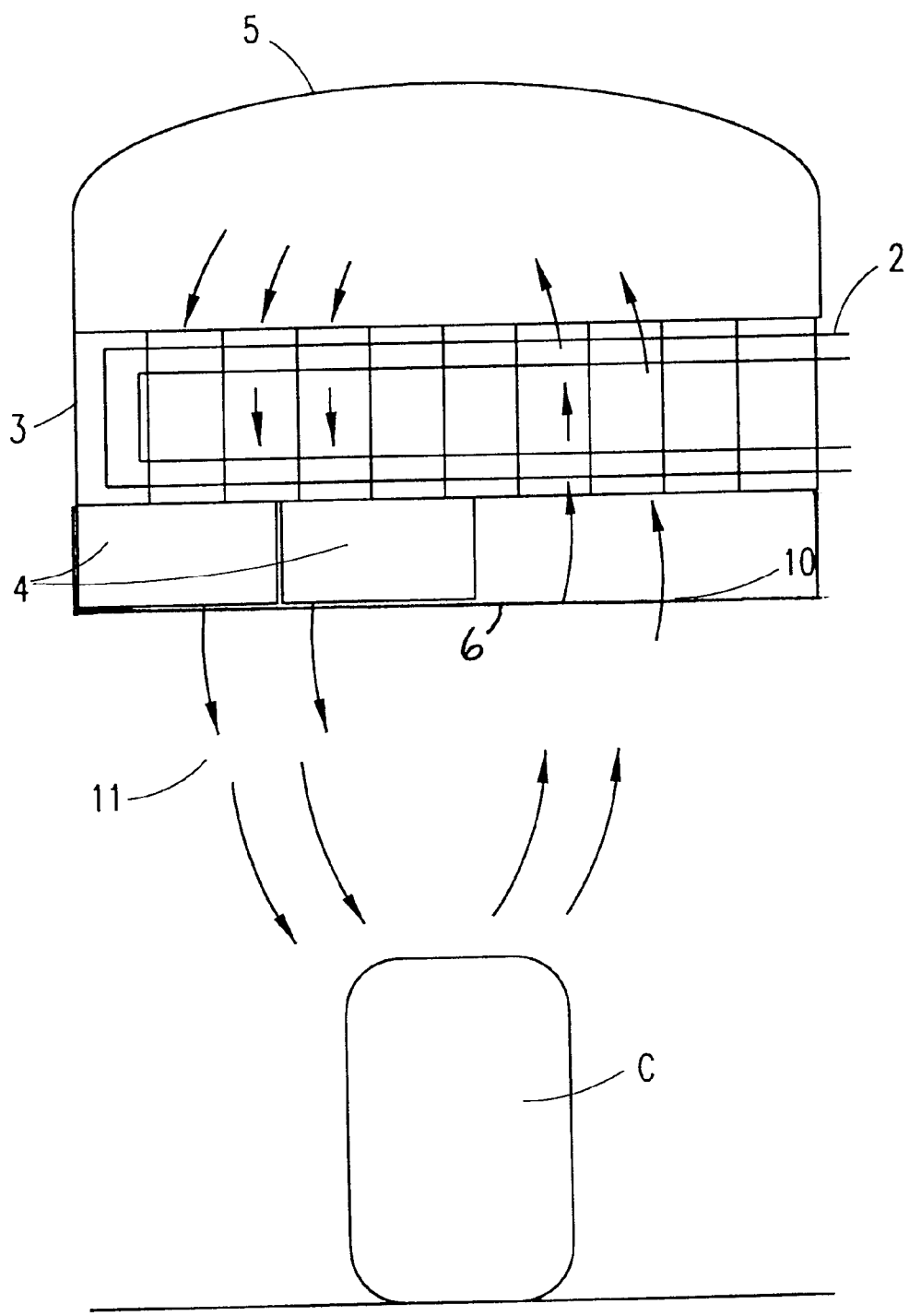
FIG. 6 is an operational diagram of the cooling system of FIG. 1 in association with heat generating equipment.
Figure 7:
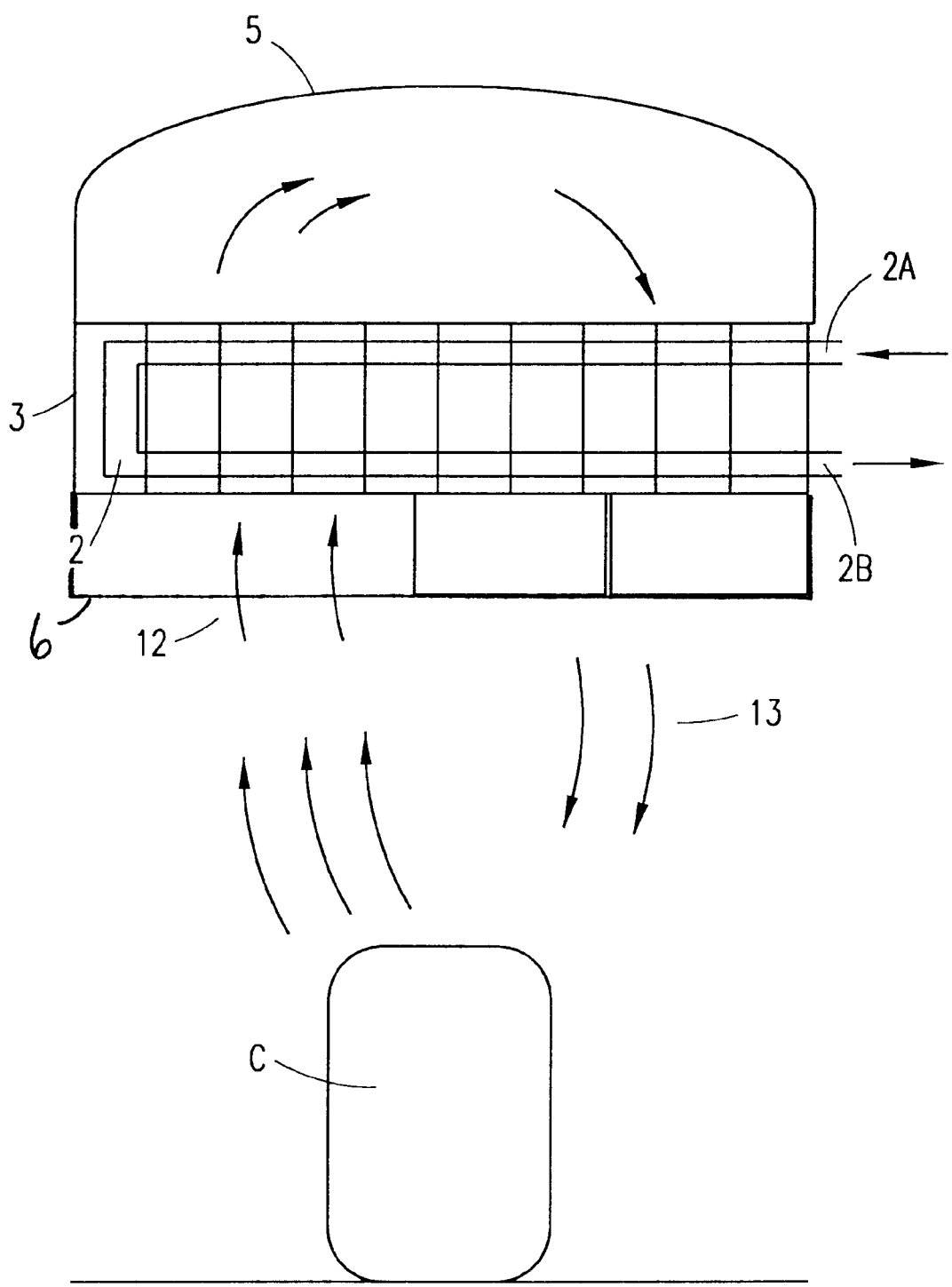
FIG. 7 is another operational diagram of the cooling system of FIG. 1 in association with heat generating equipment.

The operation of cooling system 1 will be described with reference to FIGS. 6 and 7. Initially, fan units 4 are positioned within tray member 6 of frame member 3 so as to be adjacent the desired portion 2D of heat exchanger 2. It is understood that fan units 4 may be positioned adjacent each other (as shown) or separated from each other so that a plurality of second portions 2D of heat exchanger 2 exist. Next, heated air from heat generating object C is drawn therefrom along a first path of airflow 10 through a first portion 2C of heat exchanger 2 (FIG. 6). The heated air naturally rises from heat generating object C and/or is drawn therefrom, and is collected into area A of hood assembly 5. The heated air is cooled by heat exchanger 2 a first time as the heated air passes through the first portion 2C of heat exchanger 2. The cooled air within hood assembly 5 is then drawn through a second portion 2D of heat exchanger 2 by activated fan units 4 adjacent thereto, and thereafter directed towards heat generating object C along a second path 11 of airflow. The cooled air drawn from hood assembly 5 is cooled a second time by heat exchanger 2 as the air passes through the second portion 2D of heat exchanger 2. The twice cooled air effectuates heat generating object C operating at desired operating temperatures.

In the event it is desired to change the location of the first path of airflow 10 and second path of airflow 11, such as in response to a change in the heating characteristics of the heat generating object, the fan units 4 are disconnected from frame assembly 3 by disengaging bracket member 41 of fan unit 4 from tray member 6 of frame assembly 3. Fan units 4 are then re-attached to frame unit 4 along a different portion of tray member 6 so that fan units 4 are adjacent another portion of heat exchanger 2 other than second portion 2D thereof (FIG. 7). Once fan units 4 are repositioned and activated, air heated by heat generating object C is drawn into and collected in hood assembly 5 along a third path 12 of airflow and through heat exchange 2. The collected air is then drawn from hood assembly 5 by the repositioned fan units 4, passes through heat exchanger 2 a second time and is directed towards heat generating objects C along a fourth path 13 of airflow. As a result, the paths of circulated airflow are selectively redefined by reconfiguring cooling system 1 as desired.

One advantage provided by the cooling system 1 according to the present invention concerns heat density. The cooling system 1 of the present invention are capable of possessing a heat density of approximately 200 w/ft$^2$ or more. Relative to existing cooling systems, the cooling system 1 is more capable of meeting the cooling demands of tomorrow's heat generating equipment.

Figure 9:
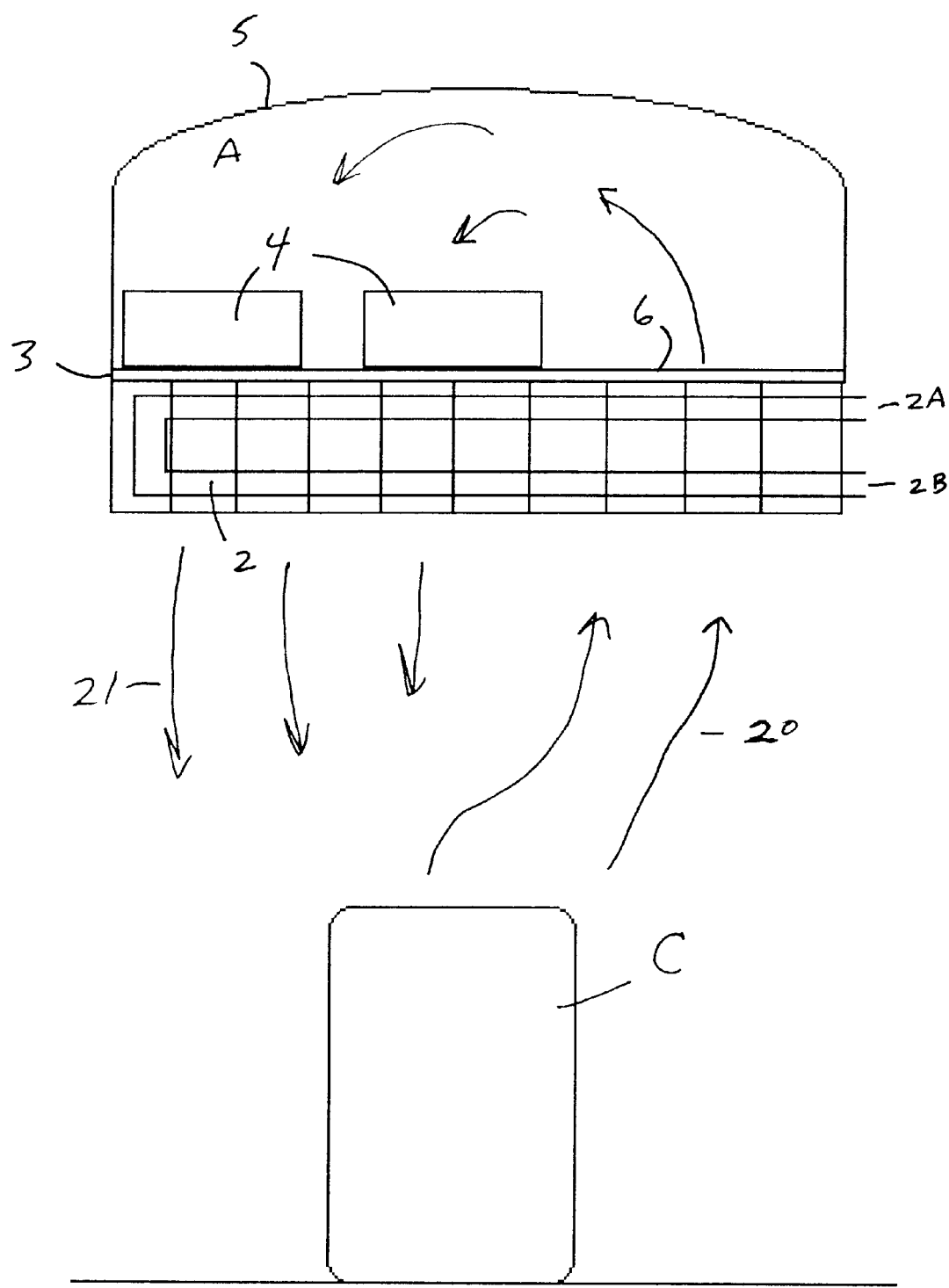
FIG. 9 is a side elevational view of a cooling system in association with heat generating equipment, in accordance with another embodiment of the present invention.

In a second embodiment of the present invention, cooling system 100 includes fan units 4 that are disposed between heat exchanger 2 and hood assembly 5 (FIG. 9). In this embodiment, tray members 6 are disposed from one end of cooling system 1 to another. Fan units 4 engage with tray members 6 as described above so that each fan unit 4 is independently positionable along tray members 6. Fans 40 within fan units 4 are operable to blow air that was previously collected along airflow paths 20 within hood assembly 5. Fans 40 blow the collected air through heat exchanger 2 and towards heat generating object C along airflow paths 21. The blown air is thus twice cooled by heat exchanger 2, a first time as the air is being collected and a second time as the air is blown from fan unit 4.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A cooling system, comprising:

a frame;

a heat exchanger unit connected to said frame such that air flow is capable of passing through the frame in proximity to said heat exchanger unit;

a fan unit connected to the frame adjacent to said heat exchanger unit, a position of said fan unit along said frame being selectively adjustable so that when said fan unit is activated, air flow passes through said frame in a first direction through a first portion of said heat exchanger unit and, without reversing said fan, air flow passes in a second direction substantially opposite said first direction through a second portion of said heat exchanger unit.

2. The cooling system of claim 1, wherein:

said fan unit is removably attached to said frame.

3. The cooling system of claim 1, wherein:

said fan unit includes a bracket member extending from opposed ends of said fan unit;

said frame includes at least one tray having a plurality of ledge members sized so that said bracket members engage therewith when said fan unit is attached to said frame.

4. The cooling system of claim 3, wherein:
each said ledge member is disposed along opposed sides of said frame.

5. The cooling system of claim 1, further including:
a hood member connected to said frame adjacent said heat exchanger units.

6. The cooling system of claim 5, wherein:
said hood member is attached to said frame along a first side thereof; and
said frame includes a tray disposed along a second side thereof, for selectively receiving said fan unit.

7. The cooling system of claim 6, wherein:
said heat exchanger unit includes an inlet and an outlet for receiving and discharging coolant, respectively, said inlet is disposed relatively near said first side of said frame, and said outlet is disposed relatively near the second side of said frame.

8. The cooling system of claim 1, wherein:
said fan unit operates to draw air from said heat exchanger unit.

9. The cooling system of claim 1, wherein:
said fan unit comprises a plurality of fan members.

10. The cooling system of claim 1, further including:
a plurality of fan units, a position of each fan unit being independently adjustable along said frame.

11. A method of cooling a heat generating object, comprising the steps of:
passing coolant through a heat exchanger;
using a fan to draw air from the heat generating object through a first portion of the heat exchanger so as to define a first path of air flow;
without reversing said fan, drawing air that passed through the first portion of the heat exchanger through a second portion of the heat exchanger so as to define a second path of air flow; and
selectively moving the first and second paths of air flow relative to the first and second portions of the heat exchanger, respectively.

12. The method of claim 11, wherein said step of drawing air through a second portion of the heat exchanger comprises the step of:
blowing air from the second portion of the heat exchanger toward the heat generating object.

13. The method of claim 12, wherein said step of blowing air comprises the step of:
operating a fan unit so that air is drawn from the second portion of the heat exchanger.

14. The method of claim 13, wherein said step of selectively moving comprises the step of:
moving the fan unit along a surface of the heat exchanger.

15. An apparatus for cooling a heat generating object, comprising:
a heat exchanger;
a fan unit operably associated with said heat exchanger so that a first path of air flow is drawn from said heat generating object through a first portion of said heat exchanger and a second path of air flow is directed towards said heat generating object through a second portion of said heat exchanger, said fan unit being selectively repositioned along said heat exchanger so as to redefine the first and second paths of air flow relative to the first and second portions of said heat exchanger, respectively.

16. The apparatus of claim 15, further comprising:
a frame assembly to which said heat exchanger is attached and said fan unit is removably attached adjacent said heat exchanger.

17. The apparatus of claim 16, further comprising:
a hood assembly attached to said frame assembly so as to receive air from said first path of air flow and redirect the air towards said second path of air flow.

18. The apparatus of claim 17, wherein:
said hood assembly is substantially dome shaped.

19. The apparatus of claim 17, wherein:
said hood assembly has tapered corner portions.

20. The apparatus of claim 16, wherein:
said frame assembly includes a tray portion disposed along the frame assembly and sized for removably receiving said fan unit therein.

21. The apparatus of claim 20, wherein:
said fan unit includes a plurality of bracket members disposed outwardly from opposed end portions of said fan unit which engage with said tray portion of said frame assembly.

22. The apparatus of claim 21, wherein said tray portion comprises:
a plurality of shelf members disposed along opposed edges of said frame assembly, said bracket members of said fan unit engage with said shelf members when said fan unit is received in said tray assembly.

23. The apparatus of claim 20, wherein:
said fan unit engages with said tray portion at any of a plurality of locations along said frame assembly.

24. The apparatus of claim 16, wherein:
said frame assembly is sized so that a plurality of said apparatuses may be disposed adjacent each other in substantially flush engagement therewith.

25. The apparatus of claim 15, further comprising:
a plurality of fan units, each fan unit being selectively and individually repositioned along said heat exchanger so as to redefine the first and second paths of air flow relative to the first and second portions of said heat exchanger, respectively.

26. The apparatus of claim 15, wherein:
said fan unit comprises a plurality of fans.

27. The apparatus of claim 15, wherein:
said fan unit is disposed adjacent said heat exchanger and blows air away therefrom when activated.

28. The apparatus of claim 15, further comprising:
a hood assembly attached to said frame assembly so as to receive air from said first path of air flow and redirect the air towards said second path of air flow;
wherein said heat exchanger includes an inlet for receiving coolant and an outlet for discharging coolant, said inlet being positioned between said hood assembly and said outlet.

29. The apparatus of claim 15, wherein:
said heat exchanger comprises at least one cooling coil.

* * * * *